(12) United States Patent
Kato et al.

(10) Patent No.: US 7,585,611 B2
(45) Date of Patent: Sep. 8, 2009

(54) PHOTOCURABLE AND THERMOSETTING RESIN COMPOSITION, DRY FILM USING THE SAME, AND CURED PRODUCT THEREOF

(75) Inventors: Kenji Kato, Hiki-gun (JP); Gen Itokawa, Hiki-gun (JP)

(73) Assignee: Taiyo Ink Mfg. Co., Ltd., Tokyo (JP)

( * ) Notice: Subject to any disclaimer, the term of this patent is extended or adjusted under 35 U.S.C. 154(b) by 0 days.

(21) Appl. No.: 11/620,350

(22) Filed: Jan. 5, 2007

(65) Prior Publication Data

US 2007/0122742 A1 May 31, 2007

Related U.S. Application Data

(63) Continuation of application No. PCT/JP2005/012494, filed on Jul. 6, 2005.

(30) Foreign Application Priority Data

Jul. 7, 2004  (JP) .............................. 2004-200961

(51) Int. Cl.
G03F 7/00 (2006.01)
G03F 7/004 (2006.01)

(52) U.S. Cl. ................. 430/270.1; 430/280.1; 430/905; 430/913; 430/945; 430/950

(58) Field of Classification Search ............. 430/270.1, 430/280.1, 286.1, 905, 913, 945, 950
See application file for complete search history.

(56) References Cited

U.S. PATENT DOCUMENTS

| | | | | |
|---|---|---|---|---|
| 5,639,546 A * | 6/1997 | Bilkadi | ....................... | 428/331 |
| 5,821,031 A | 10/1998 | Hashimoto et al. | | |
| 6,485,885 B1 * | 11/2002 | Oka et al. | ................. | 430/270.1 |
| 6,773,855 B1 | 8/2004 | Iijima et al. | | |
| 6,824,858 B2 * | 11/2004 | Iwaida et al. | ................. | 428/209 |
| 6,844,130 B2 * | 1/2005 | Nishikubo et al. | .......... | 430/258 |
| 6,861,500 B2 * | 3/2005 | Nishikubo et al. | .......... | 528/408 |
| 6,867,282 B2 * | 3/2005 | Nishikubo et al. | .......... | 528/408 |
| 6,906,116 B2 * | 6/2005 | Nishikubo et al. | .......... | 522/104 |
| 7,057,063 B2 * | 6/2006 | Nishikubo et al. | ............ | 560/90 |
| 7,132,168 B2 * | 11/2006 | Nishikubo et al. | .......... | 428/414 |
| 2003/0216514 A1 | 11/2003 | Nishikubo et al. | | |
| 2004/0067440 A1 * | 4/2004 | Minegishi et al. | ........ | 430/280.1 |
| 2005/0158661 A1 * | 7/2005 | Nishikubo et al. | ....... | 430/281.1 |
| 2006/0030636 A1 * | 2/2006 | Nishibubo et al. | .......... | 522/183 |

FOREIGN PATENT DOCUMENTS

| | | | |
|---|---|---|---|
| CN | 1157042 | | 8/1997 |
| CN | 1364247 | | 8/2002 |
| EP | 1275665 | * | 1/2003 |
| EP | 1276011 A1 | * | 1/2003 |
| EP | 1341039 A1 | * | 9/2003 |
| JP | 10-333324 A | | 12/1998 |
| JP | 2001-13682 | | 1/2001 |
| JP | 2001-278947 A | | 10/2001 |
| JP | 2002-169279 A | | 6/2002 |
| JP | 2002169279 A | * | 6/2002 |
| JP | 2002244286 A | * | 8/2002 |
| JP | 2003-202662 A | | 7/2003 |
| JP | 2003-330169 A | | 11/2003 |
| WO | WO 96/11239 A1 | | 4/1996 |
| WO | 2000/068740 A1 | | 11/2000 |
| WO | WO 2004/031860 | | 4/2004 |

* cited by examiner

Primary Examiner—Amanda C. Walke
(74) Attorney, Agent, or Firm—Oblon, Spivak, McClelland, Maier & Neustadt, P.C.

(57) ABSTRACT

A photocurable and thermosetting resin composition comprising (A) a carboxylic acid-containing photosensitive resin having at least one carboxyl group and at least two ethylenically unsaturated bonds in its molecule, (B) a filler, (C) a photopolymerization initiator, (D) a diluent, and (E) a compound having at least two cyclic ether groups and/or cyclic thioether groups in its molecule, wherein the difference between the refractive index of the carboxylic acid-containing photosensitive resin (A) and that of the filler (B) is 0.20 or less, and the average grain diameter of the filler (B) is 0.5 to 0.05 μm, and wherein the photo-curing and thermosetting resin composition can be developed by a diluted alkali solution, and can be pattern-formed by a laser oscillation light source of 350 to 420 nm in wavelength.

18 Claims, No Drawings

PHOTOCURABLE AND THERMOSETTING RESIN COMPOSITION, DRY FILM USING THE SAME, AND CURED PRODUCT THEREOF

CROSS REFERENCE TO RELATED APPLICATIONS

This is a Continuation Application of PCT Application No. PCT/JP2005/012494, filed Jul. 6, 2005, which was published under PCT Article 21(2) in Japanese.

This application is based upon and claims the benefit of priority from prior Japanese Patent Application No. 2004-200961, filed Jul. 7, 2004, the entire contents of which are incorporated herein by reference.

BACKGROUND OF THE INVENTION

1. Field of the Invention

The present invention relates to a photocurable and thermosetting resin composition capable of being pattern-formed by a laser oscillation light source of 350 to 420 nm in wavelength, a dry film using the same and a cured product thereof. More particularly, the present invention relates to a photocurable and thermosetting resin composition (i) capable of being pattern-formed by the laser oscillation light source of 350 to 420 nm in wavelength, (ii) exhibiting high sensitivity and having excellent resolving properties, and (iii) having excellent heat resistance, adhesiveness and electrical properties or the like, thereby being useful also as solder resist and capable of being developed by a diluted alkali solution, and a dry film using the same and a cured product thereof.

2. Description of the Related Art

In recent years, a direct writing method (laser direct imaging) using a laser beam as a light source has been put in practical use as a photo lithography method giving consideration to environment such as saving resources or energy saving. A direct writing device has features in which a mask manufacture process can be omitted and scaling can be applied to each substrate. The direct writing device is suitable for a multiproduct with a small lot, quick delivery and the manufacture of a multilayer circuit board.

Although the light source and wavelength of the direct writing device are replaced according to the application of the photo-curing resin composition to be used, the direct writing device is broadly classified into a type using a gas ion laser for the light source and another type using a solid laser for the light source. Argon gas is generally used in the gas laser, and a semiconductor laser and a YAG laser are used in the solid laser. When the direct writing device is classified according to the wavelength band of the laser emitted, the direct writing device is classified into an ultraviolet region type and a visible region type, and the wavelength bands of 355 nm and 488 nm are generally used.

As a resist which is adapted for the laser beam of 355 nm which is an ultraviolet ray region, a conventional known resist can be used, and for example, Jpn. Pat. Appln. KOKAI Publication No. (hereinafter referred to as JP-A-)2001-156328 (CLAIMS) or the like has been proposed. A resist which is adapted for a laser beam of 488 nm which is a visible light region is also conventionally known, and for example, JP-A-6-301208 (CLAIMS) and 2004-12635 (CLAIMS) or the like have been proposed as these resists.

Attention has been recently directed to a solid laser of 405 nm, and the solid laser has started to be used as a laser oscillation light source. Although the solid laser of 405 nm has small size, high efficient, low voltage, low power consumption and long life as compared with an argon gas laser, and a resist which is exposed at 488 nm as visible light must be used in a special environment under red light, the resist exposed at 405 nm has a feature in that the resist can be used in the existing environment under yellow light. Accordingly, the appearance of the laser cured composition having high sensitivity to the solid laser of 405 nm has been desired.

However, when the solder resist which is one of the photocuring and thermosetting resin compositions conventionally used was exposed by using the direct writing device on which a semiconductor laser of 405 nm is mounted, a coating film could not be formed because of the insufficiency of curing. It is believed that since, when taking the energy for the laser output of 355 nm into consideration, the energy for the laser output of 405 nm is very low (respectively 4 W and 0.25 W), the insufficiency of curing is caused. Since the exposure energy exceeding at least 100 mJ/cm$^2$ is required in order to cure the resin composition completely, a problem is generated in that the reduction of workability, i.e., the merit of quick delivery of the direct image forming method is lost.

In order to cure the resin composition completely in low exposure energy, it is necessary to reduce the light absorption of the resin itself with the aim of photo-curing the resin composition efficiently. However, a problem exists in that the existing resin composition comprises a compound containing a benzene ring having a conjugate double bond with large light absorption in large quantity in order to improve heat resistance.

BRIEF SUMMARY OF THE INVENTION

[Problems to Be Solved]

The present invention has been made in order to solve the problems mentioned above and its main object is to provide a photocurable and thermosetting resin composition having excellent surface curability and curing properties in deep potions to a laser oscillation light source of 350 to 420 nm in wavelength in an exposure energy of 100 mJ/cm$^2$ or less. It is another object of the present invention to provide a cured product consisting of the photocurable and thermosetting resin composition.

The present inventors, after continuing a diligent study for solving the problems mentioned above, have made the findings that, as the fundamental aspect, a photocurable and thermosetting resin composition comprising (A) a carboxylic acid-containing photosensitive resin having at least one carboxyl group and at least two ethylenically unsaturated bonds in its molecule, (B) a filler, (C) a photopolymerization initiator, (D) a diluent, and (E) a compound having at least two cyclic ether groups and/or cyclic thioether groups in its molecule, wherein the difference between the refractive index of the carboxylic acid-containing photosensitive resin (A) and that of the filler (B) is 0.20 or less, and the average grain diameter of the filler (B) is 0.5 to 0.05 μm, and the above-mentioned photocurable and thermosetting resin composition further containing (F) a resin having an ethylenically unsaturated bond can be developed by a diluted alkali solution, and can be pattern-formed by a laser oscillation light source of 350 to 420 nm in wavelength. As a result, the present invention has been perfected.

In the preferred aspect, the present inventors have made the findings that, when the content of benzene rings in the photocurable and thermosetting resin composition is 20 parts by mass or less, per 100 parts by mass of the total amount of the carboxylic acid-containing photosensitive resin (A) and the diluent (D), or per 100 parts by mass of the total amount of the carboxylic acid-containing photosensitive resin (A), the diluent (D) and the resin (F), the photocurable and thermosetting resin composition has excellent curing properties in deep potions, high sensitivity and high resolving properties. As a result, the present invention has been perfected.

As another aspect, there are provided a resin pattern obtained by photo-curing the photocurable and thermosetting resin composition or a photocurable and thermosetting dry film, obtained by applying and drying the photocurable and thermosetting resin composition onto a carrier film, using a laser beam of 350 to 420 nm in wavelength and by developing the photocured composition or the photocured dry film using a diluted alkali solution. Furthermore, there are provided a cured product obtained by thermal-curing the resin pattern, and a printed wiring board having the cured product.

The photocurable and thermosetting resin composition of the present invention has excellent surface curability and deep part curability, can be pattern-formed in an exposure energy of 100 mJ/cm$^2$ or less by using the laser oscillation light source of 350 nm to 420 nm in wavelength. The photocurable and thermosetting resin composition can be used as a laser direct imaging solder resist.

Furthermore, the use of such a laser direct imaging solder resist eliminates the use of a negative pattern, thereby contributing to the improvement in initial productivity and the reduction of costs.

Since the photocurable and thermosetting resin composition of the present invention has excellent curing properties in deep potions, high sensitivity and high resolving properties, the printed wiring board having high reliability can be provided.

DETAILED DESCRIPTION OF THE INVENTION

The photocurable and thermosetting resin composition of the present invention comprises (A) a carboxylic acid-containing photosensitive resin having at least one carboxyl group and at least two ethylenically unsaturated bonds in its molecule, (B) a filler, (C) a photopolymerization initiator, (D) a diluent, and (E) a compound having at least two cyclic ether groups and/or cyclic thioether groups in its molecule, wherein the difference of the refractive index of the carboxylic acid-containing photosensitive resin (A) and that of the filler (B) is 0.20 or less, and the average grain diameter of the filler (B) is 0.5 to 0.05 μm. The photocurable and thermosetting resin composition may further comprise (F) a resin having an ethylenically unsaturated bond for high sensitivity.

Now, the components of the photocurable and thermosetting resin composition of the present invention will be described in detail below.

First, the carboxylic acid-containing photosensitive resin (A) is a compound which is cured by the action of the photopolymerization initiator (C). As long as the carboxylic acid-containing photosensitive resin (A) has at least one carboxyl group and at least two ethylenically unsaturated bonds in its molecule, the carboxylic acid-containing photosensitive resin (A) may be in any forms of a monomer, an oligomer, a prepolymer and a resin.

The carboxylic acid-containing photosensitive resin (A) can be cured by the irradiation of active energy ray, and the uncured coating film can be removed by the diluted alkali solution in the presence of the carboxyl group. For example, there can be used various photocurable components which have been heretofore known in the art, such as photosensitive resins described in JP-A-51-131706, 52-94388, 64-62375, 2-97513, 2-113252, 3-253093, 3-289656, and Jpn. Pat. Appln. KOKOKU Publication No. (hereinafter referred to as JP-B-) 63-46791, 1-54390 and 1-32868, JP-A-2002-363231, and the like.

Specific examples of the carboxylic acid-containing photosensitive resins (A) include:

(1) a carboxylic acid-containing photosensitive resin obtained by adding an ethylene unsaturated group as a pendant to a copolymer of an unsaturated carboxylic acid and a compound having an unsaturated double bond;

(2) a carboxylic acid-containing photosensitive resin obtained by causing an unsaturated carboxylic acid to react with a copolymer of a compound having an epoxy group and an unsaturated double bond and a compound having an unsaturated double bond and then causing a polybasic acid anhydride to react with the secondary hydroxyl group caused by the above reaction;

(3) a carboxylic acid-containing photosensitive resin obtained by causing a compound having a hydroxyl group and an unsaturated double bond to react with a copolymer of an acid anhydride having an unsaturated double bond and a compound having an unsaturated double bond;

(4) a carboxylic acid-containing photosensitive resin obtained by causing a polyfunctional epoxy compound to react with an unsaturated monocarboxylic acid and then causing a polybasic acid anhydride to react with the secondary hydroxyl group caused by the above reaction;

(5) a carboxylic acid-containing photosensitive resin obtained by causing a compound having an epoxy group and an unsaturated double bond to react with a carboxylic acid-containing resin obtained by causing a polybasic acid anhydride to react with a hydroxyl group-containing polymer;

(6) a carboxylic acid-containing photosensitive resin obtained by causing an unsaturated monocarboxylic acid to react with a polyfunctional oxetane compound and then causing a polybasic acid anhydride to react with the primary hydroxyl group of the resultant modified oxetane resin; and (7) an carboxylic acid-containing photosensitive resin obtained by adding an epoxy group-containing unsaturated compound to acidic groups of a part of a copolymer consisting of an ethylene unsaturated group-containing carboxylic acid represented by the following general formula (1) or (2) and a methacrylate or acrylate monomer.

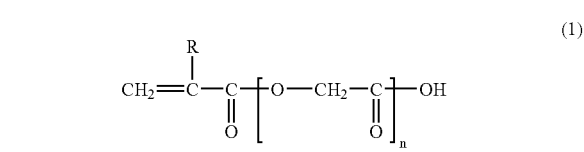

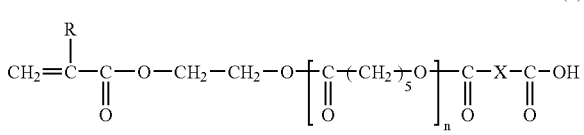

In the general formulae (1) and (2), n is an integer of 1 to 10; R represents a hydrogen atom or a methyl group; and X represents an (anhydride) carboxylic acid residue having 1 to 4 carbon atoms.

Any one carboxylic acid-containing photosensitive resin described above has at least one carboxyl group and at least two ethylenically unsaturated bonds in its molecule, and the acid value for solid is preferably 10 to 150 mgKOH/g, and more preferably 30 to 130 mgKOH/g. If the acid value is less than 10 mgKOH/g, it is difficult to remove an uncured film by a diluted aqueous alkaline solution. On the other hand, if the acid value exceeds 150 mgKOH/g, the water resistance and electrical properties of a cured coating film tend to begin worse.

The weight-average molecular weight of the carboxylic acid-containing photosensitive resin is preferably 5,000 to 150,000, and more preferably 5,000 to 100,000. If the weight-average molecular weight is less than 5,000, tack-free properties may deteriorate, and the film thinning during the development thereof may be caused by the poor moisture resistance of the coating film after the exposure, and the degree of resolution may be far inferior. On the other hand, if the weight-average molecular weight exceeds 150,000, the developability may significantly become worse, and the storage stability tends to deteriorate.

Next, when the difference between the refractive index of the filler (B) used in the present invention and that of the carboxylic acid-containing photosensitive resin (A) is 0.2 or less and the average grain diameter of the filler (B) is 0.5 to 0.05 μm, any fillers (B) may be used. If the refractive index difference exceeds 0.2, the light scattering may occur and the curing properties in deep potions tend to grow worse, which is unpreferable. Additionally, if the average grain diameter of the filler exceeds 0.5 μm, the light scattering may occur and the curing properties in deep potions tend to grow worse, which is also unpreferable. On the other hand, if the average grain diameter of the filler is 0.05 μm or less, the grain diameter is smaller than a wavelength (350 nm to 420 nm) used for exposure in the present invention. Thereby it is hard to cause the scatter of light, and it is not necessary to limit the refractive index particularly.

Examples of the marketed commodities of the above filler (B) include spherical silica (1-FX produced by Tatsumori Ltd.), spherical silica (Adomafine SO-C1produced by Tatsumori Ltd.) and barium sulfate (B-30 produced by Sakai Chemical Industry Co., Ltd.), and they may be used either singly or in the form of a combination of two or more members. It is preferable that the spherical silica having little light scattering is used as the preferred filler (B). These fillers (B) are used in order to control the cured contraction of the coating film to enhance fundamental characteristics such as adhesiveness and hardness, and in order to control the hindrance of the reflection and refraction or the like of the light when the active energy ray transmits in the photocurable resin composition.

Examples of the fillers hardly causing the scatter of the light of 350 to 420 nm include NANOPOX and NANOCRYL (all trade group names) in which silica of about 20 nm is uniformly dispersed in the epoxy resin or the polyfunctional acrylate compound and which is produced by Hanse-Chemie Company.

It is preferable that the filler (B) presents in the ratio of 0.1 to 300 parts by mass per 100 parts by mass of the carboxylic acid-containing photosensitive resin (A). It is more preferable that the filler (B) presents in the ratio of 0.1 to 150 parts by mass. When the filler (B) is less than 0.1 part by mass, the heat resistance of the cured product of the photocurable resin composition is inferior, and fundamental solder resist characteristics such as solder heat resistance and resistance to gold plating are not obtained. On the other hand, when the filler (B) is more than 300 parts by mass, the viscosity of the photocurable resin composition is increased to reduce printability. A trouble such as the very weak cured product of the photocurable resin composition is also caused.

The typical photopolymerization initiators (C) include benzoin and benzoin alkyl ethers such as benzoin, benzoin methyl ether, benzoin ethyl ether, and benzoin isopropyl ether; acetophenones such as acetophenone, 2,2-dimethoxy-2-phenyl acetophenone, 2,2-diethoxy-2-phenyl acetophenone, and 1,1-dichloroacetophenone; aminoacetophenones such as 2-methyl-1-[4-(methylthio)phenyl]-2-morpholinoaminopropanone-1,2-benzyl-2-dimethylamino-1-(4-morpholinophenyl)butan-1-one, and N,N-dimethyl aminoacetophenone; anthraquinones such as 2-methylanthraquinone, 2-ethylanthraquinone, 2-t-butyl-anthraquinone, and 1-chloroanthraquinone; thioxanthones such as 2,4-dimethylthioxanthone, 2,4-diethylthioxanthone, 2-chlorothioxanthone and 2,4-diisopropylthioxanthone; ketals such as acetophenone dimethyl ketal and benzyl dimethyl ketal; organic peroxides such as benzoyl peroxide and cumene peroxide; thiol compounds such as 2,4,5-triarylimidazole dimer, riboflavin tetrabutilate, 2-mercaptobenzoimidazole, 2-mercaptobenzooxazole and 2-mercaptobenzothiazole; organohalogen compounds such as 2,4,6-tris-s-triazine, 2,2,2-tribromoethanol, tribromomethylphenylsulfone; benzophenones or xanthones such as benzophenone and 4,4'-bisdiethylaminobenzophenone; and 2,4,6-trimethylbenzoyl diphenyl phosphine oxide. These well-known and widely used photopolymerization initiators may be used either singly or in the form of a mixture of two or more members. There can be further added a photoinitiation aid. The photoinitiation aid is, for example, tertiary amines such as ethyl N,N-(dimethylamino) benzoate, isoamyl N,N-(dimethylamino)benzoate, pentyl-4-dimethylaminobenzoate, triethylamine and triethanolamine, and a benzophenone compound. Although the particularly preferred photopolymerization initiator is 2-methyl-1-[4-(methylthio)phenyl]-2-morpholinoaminopropanone-1 (Irgacure 907, produced by Ciba Specialty Chemicals K.K.), 2-benzil-2-dimethylamino-1-(4-morpholinophenyl)-butane-1-one (Irgacure 369, produced by Ciba Specialty Chemicals K.K.), and thioxanthones, the photopolymerization initiator is not particularly limited thereto. As long as a compound absorbs light in the wavelength region of 350 to 420 nm and radical-polymerizes an unsaturated group such as a methacrylyl or acrylyl group, the compound may be used either singly or in the form of a mixture of two or more members without limiting the photopolymerization initiator and the photoinitiation aid.

A compound having an oxime ester group represented by the following general formula (3) can also be used.

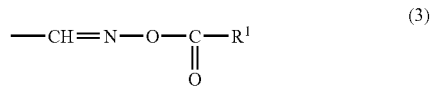

(3)

In the formula (3), $R^1$ represents a hydrogen atom, a methyl group, a phenyl group, a biphenyl group, or a phenyl group or biphenyl group respectively substituted with an alkyl group of 1 to 6 carbon atoms. Examples thereof include 1,2-octanedion, 1-[4-(phenylthio)-2-(O-benzoyl oxime)] (Irgacure OXE, produced by Ciba Specialty Chemicals K.K.), 1-phenyl-1,2-propanedion-2(O-ethoxycarbonyl)oxime (Quantacure PDO, produced by International Bio-Synthestics Company). However, the preferred oxime ester compound is a thioxanthone compound, and the thioxanthone compound represented by the following general formula (4) is particularly preferable.

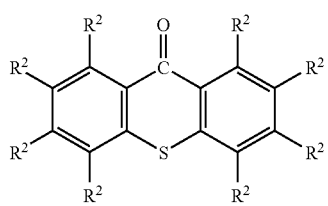

(4)

In the formula (4), one or two R²'s represent the oxime ester group represented by the general formula (3), and the other R²'s represent a hydrogen atom, a methyl group, a phenyl group or a halogen atom. The most preferred oxime ester compound is a thioxanthone compound represented by the following formula (5).

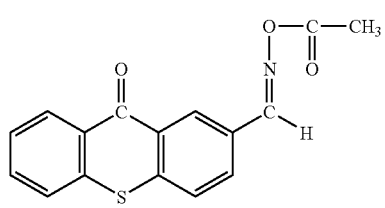

(5)

The thioxanthone compound of the above formula (5) may be used either singly or in the form of a mixture of the thioxanthone compound and the above well-known and widely used photopolymerization initiator. There can be further added photoinitiation aids. The photoinitiation aid is, for example, tertiary amines such as N,N-ethyl dimethylaminobenzoic acid ester, N,N-dimethylamino benzoic acid isoamyl ester, penthyl-4-dimethylamino benzoate, triethyl amine and triethanol amine, and a benzophenone compound.

It is preferable that the content of the above photopolymerization initiator (C) is 0.01 to 50 parts by mass per 100 parts by mass of the carboxylic acid-containing photosensitive resin (A). When the content of the photopolymerization initiator (C) is less than 0.01 part by mass per 100 parts by mass of the carboxylic acid-containing photosensitive resin (A), the carboxylic acid-containing photosensitive resin (A) is not sufficiently cured by the light of a wavelength region of 350 to 420 nm. Also, the resistance to PCT (pressure cooker test) tends to be reduced by the increase of the hygroscopic property of the cured film, and the solder heat resistance and the electroless plating property resistance are also easily reduced. On the other hand, when the photopolymerization initiator (C) presents in an amount of more than 50 parts by mass per 100 parts by mass of the carboxylic acid-containing photosensitive resin (A), the developability of the coating film and the electroless plating property resistance of the cured coating film are worsened. Also, the resistance to PCT tends to be also inferior. It is more preferable that the content of the photopolymerization initiator (C) is 0.1 to 30 parts by mass per 100 parts by mass of the carboxylic acid-containing photosensitive resin (A).

The photocurable and thermosetting resin composition of the present invention can comprise a tertiary amine compound and the benzophenone compound as the photopolymerization initiation aids. Examples of the tertiary amines include ethanol amines, 4,4'-dimethylamino benzophenone (Nissocure MABP, produced by Nippon Soda Co., Ltd.), 4-ethyl dimethylaminobenzoic acid (Kayacure EPA, produced by Nippon Kayaku Co., Ltd.), 2-ethyl dimethylaminobenzoic acid (Quantacure DMB, produced by International Bio-Synthestics Company), 4-dimethylaminobenzoic acid (n-butoxy)ethyl (Quantacure BEA, produced by International Bio-Synthestics Company), P-dimethylamino benzoic acid isoamyl ethyl ester (Kayacure DMBI, produced by Nippon Kayaku Co., Ltd.), 4-dimethylamino benzoic acid 2-ethyl hexyl (Esolol 507, produced by Van Dyk Company), and 4,4'-diethylaminobenzophenone (EAB, produced by Hodogaya Chemical Co., Ltd.). These well-known and widely used tertiary amine compounds may be used either singly or in the form of a mixture of two or more members. Although the particularly preferable tertiary amine compound is 4,4'-diethylaminobenzophenone, the tertiary amine compound is not limited thereto. The tertiary amine compound absorbing light in a region of a wavelength of 350 to 420 nm and exhibiting an sensitizing effect using together with a hydrogen abstraction type photopolymerization initiator may be used either singly or in the form of a combination of two or more members without limiting the photopolymerization initiator and the photopolymerization initiation aids.

Examples of the benzophenone compound include 4-benzoyl diphenyl sulfide, 4-benzoyl-4'-methyl diphenyl sulfide (Kayacure BMS, produced by Nippon Kayaku Co., Ltd.), 4-benzoyl-4'-ethyl diphenyl sulfide and 4-benzoyl-4'-propyl diphenyl sulfide. These well-known and widely used benzophenone compounds may be used either singly or in the form of a mixture of two or more members. Although the particularly preferred benzophenone compounds are 4-benzoyl-4'-methyldiphenylsulfide, the benzophenone compound is not limited thereto. As long as the benzophenone compound absorbs light in a region of a wavelength of 350 to 420 nm and radical-polymerize an unsaturated group such as a methacryloyl group or an acryloyl group, the benzophenone compounds may be used either singly or in the form of a combination of two or more members without limiting the photopolymerization initiator and the photopolymerization initiation aids.

Furthermore, in the photocurable and thermosetting resin composition of the present invention, the photopolymerizable vinylic monomer and/or the organic solvent can be used as the diluent (D). Typical examples of the photopolymerizable vinylic monomers include hydroxyalkyl acrylates such as 2-hydroxyethyl acrylate and 2-hydroxypropyl acrylate; mono- or di-acrylates of glycol such as ethylene glycol, methoxytetra ethylene glycol, polyethylene glycol and propylene glycol; acrylamides such as N,N-dimethyl acrylamide, N-methylol acrylamide and N,N-dimethylaminopropyl acrylamide; aminoalkyl acrylates such as N,N-dimethylaminoethyl acrylate and N,N-dimethylaminopropyl acrylate; polyalcohols such as hexanediol, trimethylolpropane, pentaerythritol, dipentaerythritol and tris-hydroxyethyl isocyanurate, or polyacrylates such as an ethylene oxide adduct or propylene oxide adduct thereof; acrylates such as phenoxy acrylate, bisphenol A diacrylate, and an ethylene oxide adduct or propylene oxide adduct of phenols thereof; acrylates of glycidyl ethers such as glycerin diglycidyl ether, glycerin triglycidyl ether, trimethylol propane triglycidyl ether and triglycidyl isocyanurate; and each of methacrylates corresponding to melamine acrylate and/or the acrylate.

Examples of the organic solvent include ketones, aromatic hydrocarbons, glycol ethers, glycol ether acetates, esters, alcohols, aliphatic hydrocarbons and a petroleum solvent. More specific examples thereof include ketones such as methyl ethyl ketone and cyclohexanone; aromatic hydrocarbons such as toluene, xylene and tetramethyl benzene; glycol ethers such as cellosolve, methyl cellosolve, butyl cellosolve, carbitol, methyl carbitol, butyl carbitol, propylen eglycol monomethyl ether, dipropylene glycol monomethyl ether, dipropylene glycol diethyl ether and triethylene glycol monoethyl ether; glycol ether acetates such as dipropylene glycol methyl ether acetate, propylene glycol methyl ether acetate, propylene glycol ethyl ether acetate and propylene glycol butyl ether acetate; esters such as ethyl acetate, butyl acetate and esters of an acetic acid of the above glycol ethers; alcohols such as ethanol, propanol, ethylene glycol and propylene glycol; aliphatic hydrocarbons such as octane and decane; and petroleum solvents such as petroleum ether, petroleum naphtha, hydrogenated petroleum naphtha, solvent naphtha.

The diluents may be used either singly or in the form of a mixture of two or more members, and the amount of the diluent to be used is preferably 10 to 60 parts by mass per 100 parts by mass of the carboxylic acid-containing photosensitive resin (A), more preferably 15 to 50 parts by mass. When the amount of the diluent to be used is more than 60 parts by mass, it is not preferable that the tack-free is worsened. (E) a compound having at least two cyclic ether groups and/or cyclic thioether groups in its molecule (hereinafter referred to as cyclic(thio)ether) has a cyclic(thio)ether group having three-, four-, or five-membered rings and containing an oxygen atom or a sulfur atom. Among the compound (E), the compound having at least two cyclic (thio)ether groups in its molecule is preferable. For example, a compound having at least two epoxy groups in its molecule, that is, a polyfunctional epoxy compound (E-1) and/or a compound having at least two oxetane groups, in its molecule, that is, a polyfunctional oxetane compound (E-2) can be suitably used.

Examples of the polyfunctional epoxy compound (E-1) include bisphenol A type epoxy resins such as EPIKOTE 828, EPIKOTE 834, EPIKOTE 1001, and EPIKOTE 1004 produced by Japan Epoxy resin K.K., EPICLON 840, EPICLON 850, EPICLON 1050, and EPICLON 2055 produced by Dainippon Ink and Chemicals Inc., Epo Tohto YD-011, YD-013, YD-127, and YD-128 produced by Tohto Kasei Co., Ltd., D.E.R.317, D.E.R.331, D.E.R.661 and D.E.R.664 produced by Dow Chemical Co., Araldide 6071, Araldide 6084, Araldide GY250 and Araldide GY260 produced by Ciba Specialty Chemicals K.K., and Sumi-epoxy ESA-011, ESA-014, ELA-115 and ELA-128 produced by Sumitomo Chemical Co., Ltd., A.E.R.330, A.E.R.331, A.E.R.661, A.E.R.664 (all trade names) produced by Asahi Kasei Corporation; brominated epoxy resins such as EPIKOTE YL903 produced by Japan Epoxy resin K.K., EPICLON 152 and EPICLON 165 produced by Dainippon Ink and Chemicals Inc., Epo Tohto YDB-400 and YDB-500 produced by Tohto Kasei Co., Ltd., D.E.R.542 produced by Dow Chemical Co., Araldide 8011 produced by Ciba Specialty Chemicals K.K., Sumi-epoxy ESB-400 and ESB-700 produced by Sumitomo Chemical Co., Ltd., A.E.R.711 and A.E.R.714 (all trade names) produced by Asahi Kasei Corporation; novolak type epoxy resins such as EPIKOTE 152 and EPIKOTE 154 produced by Japan Epoxy resin K.K., D.E.N.431 and D.E.N.438 produced by Dow Chemical Co., EPICLON N-730, EPICLON N-770, and EPICLON N-865 produced by Dainippon Ink and Chemicals Inc., Epo Tohto YDCN-701 and YDCN-704 produced by Tohto Kasei Co., Ltd., Araldide ECN1235, Araldide ECN1273, Araldide ECN1299, and Araldide XPY307 produced by Ciba Specialty Chemicals K.K., EPPN-201, EOCN-1025, EOCN-1020, EOCN-104S and RE-306 produced by Nippon Kayaku Co., Ltd., Sumi-Epoxy ESCN-195X and ESCN-220 by Sumitomo Chemical Co., Ltd., and A.E.R, ECN-235, ECN-299 (all trade names) produced by Asahi Kasei Corporation; bisphenol F type epoxy resins such as EPICLON 830 produced by Dainippon Ink and Chemicals Inc., EPIKOTE 807 produced by Japan Epoxy resin K.K., Epo Tohto YDF-170, YDF-175 and YDF-2004 produced by Tohto Kasei Co., Ltd., and Araldide XPY306 (all trade names) produced by Ciba Specialty Chemicals K.K.; hydrogenated bisphenol A type epoxy resins such as Epo Tohto ST-2004, ST-2007 and ST-3000 produced by Tohto Kasei Co., Ltd. (trade names); glycidylamine type epoxy resins such as EPIKOTE 604 produced by Japan Epoxy resin K.K., Epo Tohto YH-434 produced by Tohto Kasei Co., Ltd., Araldide MY720 by produced by Ciba Specialty Chemicals K.K., and Sumi-Epoxy ELM-120 (all trade names) produced by Sumitomo Chemical Co., Ltd.; hydantoin type epoxy resins such as Araldide CY-350 (trade name) produced by Ciba Specialty Chemicals K.K.; alicyclic epoxy resins such as Celloxide 2021 produced by Produced by Daicel Chemical Industries, Ltd. and Araldides CY175 and CY179 (all trade names) produced by Ciba Specialty Chemicals K.K.; trihydroxyphenyl methane type epoxy resins such as YL-933 produced by Japan Epoxy resin K.K. and T.E.N., EPPN-501 and EPPN-502 (all trade names) produced by Dow Chemical Co.; bixylenol type or biphenol type epoxy resins or mixtures thereof such as YL-6056, YX-4000 and YL-6121 (all trade names) produced by Japan Epoxy resin K.K.; bisphenol S type epoxy resins such as EBPS-200 produced by Nippon Kayaku Co., Ltd., EPX-30 produced by Asahi Denka Kogyo K.K., and EXA-1514 (trade name) produced by Dainippon Ink and Chemicals Inc.; bisphenol A novolak type epoxy resins such as EPIKOTE 157S (trade name) produced by Japan Epoxy resin K.K.; tetraphenylol ethane type epoxy resins represented by EPIKOTE YL-931 produced by Japan Epoxy resin K.K. and Araldide 163 (all trade names) produced by Ciba Specialty Chemicals K.K.; heterocyclic epoxy resins such as Araldide PT810 produced by Ciba Specialty Chemicals K.K and TEPIC (all trade names) produced by Nissan Chemical Industries Ltd.; diglycidyl phthalate resins such as BLEMMER DGT produced by Nippon Oil and Fats Co., Ltd.; tetraglycidyl xylenoyl ethane resins such as ZX-1063 produced by Tohto Kasei Co., Ltd.; naphthalene group-containing epoxy resins such as ESN-190 and ESN-360 produced by Shinnittetsu Chemical Co., Ltd. and HP-4032, EXA-4750 and EXA-4700 produced by Dainippon Ink and Chemicals Inc.; dicyclopentadiene skeleton-containing epoxy resins such as HP-7200 and HP-7200H produced by Dainippon Ink and Chemicals Inc.; glycidyl methacrylate copolymer type epoxy resins such as CP-50S and CP-50M produced by Nippon Oil and Fats Co., Ltd.; copolymeric epoxy resin of cyclohexylmaleimide and glycidyl methacrylate; epoxy modified polybutadiene rubber derivatives (for example, PB-3600 or the like produced by Daicel Chemical Industries, Ltd.); and CTBN modified epoxy resins (for example, YR-102 and YR-450 or the like produced by Tohto Kasei Co., Ltd.,). However, the polyfunctional epoxy compound is not limited thereto. These epoxy resins may be used either singly or in the form of a combination of two or more members. Among these epoxy resins, the novolak type epoxy resins, the heterocyclic epoxy resins, the bisphenol A type epoxy resins, or the mixture thereof are particularly preferable.

Examples of the polyfunctional oxetane compound (E-2) include bis[(3-methyl-3-oxetanylmethoxy)methyl]ether, bis [(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl) methyl acrylate, (3-ethyl-3-oxetanyl)methyl acrylate, (3-methyl-3-oxetanyl)methyl methacrylate, (3-ethyl-3-oxetanyl)methyl methacrylate and oligomers thereof or polyfunctional oxetanes of a copolymer, and ethers of oxetane and resin having hydroxyl groups such as a novolac resin, poly (p-hydroxy styrene), a cardo type bisphenols, calixarenes, calixresorcinarenes or silsesquioxane. The other examples include a copolymer of an unsaturated monomer having an oxetane ring and alkyl(meta)acrylate.

Examples of the compound having at least two cyclic thioether groups in its molecule include a bisphenol A type episulfide resin YL7000 produced by Japan Epoxy resin K.K. An episulfide resin or the like in which an oxygen atom of an epoxy group of the novolak type epoxy resin is replaced with a sulfur atom can be used by using the same synthesizing method.

The cyclic(thio)ether (E) is sufficiently used in an amount of 10 parts by mass or more and 100 parts by mass or less per 100 parts by mass of the carboxylic acid-containing photosensitive resin (A), and is preferably used in an amount of 25 to 60 parts by mass. When the content of the cyclic(thio)ether (E) is less than 10 parts by mass per the carboxylic acid-containing photosensitive resin (A), the hygroscopicity of the cured coating film is increased, and the resistance to PCT tends to be reduced. Also, the solder heat resistance and the electroless plating property resistance tend also be reduced. On the other hand, when the mixed amount of the cyclic(thio) ether (E) is more than 100 parts by mass per the carboxylic acid-containing photosensitive resin (A), the developability of the coating film and the electroless plating property resistance of the cured coating film are worsened, and the resistance to PCT is also inferior.

When the above cyclic (thio)ether compound is used, it is preferable that the cyclic (thio)ether compound contains a curing catalyst. Examples of the curing catalyst include imidazole derivatives such as imidazole, 2-methylimidazole, 2-ethylimidazole, 2-ethyl-4-methylimidazole, 2-phenylimidazole, 4-phenylimidazole, 1-cyanoethyl-2-phenylimidazole, 1-(2-cyanoethyl)-2-ethyl-4-methylimidazole; amine compounds such as dicyandiamide, benzyldimethylamine, 4-(dimethylamino)-N,N-dimethylbenzylamine, 4-methoxy-N,N-dimethylbenzylamine, 4-methyl-N,N-dimethylbenzylamine; hydrazine compounds, such as adipic hydrazide and sebacic hydrazide; phosphorus compounds such as triphenylphosphine; 2 MZ-A, 2 MZ-OK, 2PHZ, 2P4BHZ and 2P4MHZ produced by Shikoku Chemicals Corporation (all trade names of imidazole type compounds), U-CAT 3503N and U-CAT 3502T (all trade names of block isocyanate compounds of dimethylamine) produced by SAN-APRO LIMITED, and DBU, DBN, U-CATSA102, U-CAT5002 (all two-ring type amidin compounds and the salts thereof) as a commercialized product. The curing catalysts are not particularly limited thereto, and the curing catalysts need only to promote the reaction of the curing catalyst of the epoxy resin or oxetane compound or the epoxy group and/or the oxetanyl group, and carboxyl group. The curing catalysts may be used either singly or in the form of a mixture of two or more members. There can be also used S-triazine derivatives such as guanamine, acetoguanamine, benzo guanamine, melamine, 2,4-diamino-6-methacryloyloxyethyl-S-triazine, 2-vinyl-4,6-diamino-S-triazine, 2-vinyl-4,6-diamino-S-triazine/isocyanuric acid adduct and 2,4-diamino-6-methacryloyloxyethyl-S-triazine/isocyanuric acid adduct which function also as an adhesiveness-imparting agent. Preferably, a compound which functions also as these adhesiveness-imparting agents is used together with the thermal curing catalyst.

The content of the thermal curing catalyst may be the usual quantitative ratio, and is, for example, 0.1 to 20 parts by mass, preferably 0.5 to 15.0 parts by mass per 100 parts by mass of the carboxylic acid-containing photosensitive resin (A) or the cyclic(thio)ether compound (E).

In the preferred aspect of the present invention, the compound having the ethylenically unsaturated bond in the resin composition may be used as the resin (F). Examples thereof include a solid or half-solid resin of polyfunctional ethylenically unsaturated bond-containing resin or the like obtained by acrylatizing a cresol novolak type epoxy resin and by adding a half urethane of isoholon diisocyanate and hydroxyl group-containing (meth)acrylate compound such as pentaerythritoltriacrylate to the generated secondary hydroxyl group. They may be used either singly or in the form of a combination of two or more members.

Preferably, the ethylenically unsaturated bond-containing resin (F) is contained in the ratio of 100 or less parts by mass per 100 parts by mass of the carboxylic acid-containing photosensitive resin (A). More preferably, the ethylenically unsaturated bond-containing resin (F) is contained in the ratio of 1 to 70 parts by mass. When the content of the ethylenically unsaturated bond-containing resin (F) is more than 100 parts by mass, the viscosity of the photocurable resin composition is increased to reduce printablility. Furthermore, a trouble such as the very weak cured product of the photocurable resin composition are also caused.

In the photocurable and thermosetting resin composition of the present invention, it is preferable that the benzene rings are contained in a ratio of 20 parts by mass or less per 100 parts by mass of the total amount of the carboxylic acid-containing photosensitive resin (A) having at least one carboxyl group and at least two ethylenically unsaturated bonds in its molecule and diluent (D), or per 100 parts by mass of the total amount of the carboxylic acid-containing photosensitive resin (A) having at least one carboxyl group and at least two ethylenically unsaturated bonds in its molecule, diluent (D) and resin (F) having the ethylenically unsaturated bond. It is because when the content of benzene rings is in an amount of more than 20 parts by mass, absorption of light is increased and curing properties in deep portions are hard to be obtained.

The photocurable and thermosetting resin composition of the present invention may further incorporate therein, when necessary, a well-known and widely used additive such as a well-known and widely used coloring pigment like phthalocyanine blue, phthalocyanine green, Iodine Green, disazo yellow, crystal violet, titanium dioxide, carbon black and naphthalene black; a well-known and widely used thermal polymerization inhibitor like hydroquinone, hydroquinone monomethyl ether, t-butyl catechol, pyrogallol and phenothiazine; a well-known and widely used thickening agent like fine powder silica, organic bentonite and montomorillonite; an anti-foaming agent and/or leveling agent of a silicone type, a fluorine type and a macromolecular type; and an imidazole type, thiazole type and triazole type silane coupling agents.

The photocurable and thermosetting resin composition of the present invention can be provided in liquid, paste or dry film-like form. When the photocurable and thermosetting resin composition is supplied as the dry film, after the resin composition of the present invention is applied on, for example, a base film (mold releasing film) by using a roll coater, a doctor bar, a wire bar method, a dipping method, a spin coat method, a photogravure method and a doctor blade method or the like, the dry film can be obtained by drying the resin composition in a drying furnace set to 60 to 100° C., and removing the organic solvent of a prescribed amount or sticking a mold releasing film or the like if needed. In this case, the thickness of the resist on the base film is preferably set to 5 to 160 µm, and more preferably 10 to 60 µm. As the above base film, films such as polyethylene terephthalate and polypropylene are suitably used.

The photocurable and thermosetting resin composition of the present invention is applied on a substrate by methods such as a screen printing method, a curtain coat method, a spray coat method and a roll coat method, and for example, the organic solvent contained in the composition is volatilized and dried at a temperature of about 60 to 100° C., thereby forming a coating film having excellent tack-free dryness and a long development life.

Examples of the substrate include a copper-clad laminate of all grades (FR-4 or the like) using the quality of material of a copper-clad laminate for high frequency circuit using paper phenol, paper epoxy, glass fabric epoxy, glass polyimide, glass fabric/nonwoven epoxy, glass fabric/paper epoxy, synthetic fabric epoxy, fluoride/polyethylene/PPO/cyanate ester or the like. The other examples thereof include a polyimide film, a PET film, a glass substrate, a ceramic substrate and a wafer board.

The volatilization dryness performed after applying the photocurable and thermosetting resin composition of the present invention can be performed by using a hot air circulation type drying oven, an IR furnace, a hot plate and a convection oven or the like (a method for making a hot wind countercurrent-contact in a drier by using one equipped with a heat source of an air heating method due to steam, and a method for spraying a hot wind on a support from a nozzle).

As described above, after the photocurable and thermosetting resin composition of the present invention is applied, volatilized and dried, the obtained coating film is exposed (the irradiation of the active energy ray). An exposure part (a part irradiated by the active energy ray) in the coating film is cured.

A direct writing device (for example, a laser direct imaging device directly forming an image by laser by CAD data from a computer) can be used as an exposure device when exposing. When the laser beam of 350 to 420 nm in wavelength as the active energy ray is used, a gas laser or a solid laser may be used. It is particularly preferable that a violet laser diode (405 nm) is used as a light source. Although the exposure energy depends on the film thickness or the like, generally, the exposure energy is set to 10 to 200 mJ/cm$^2$, preferably 20 to 100 mJ/cm$^2$, and more preferably 30 to 80 mJ/cm$^2$. For example, the above direct writing devices produced by PENTAX Corporation, Hitachi Via Mechanics Company and Ball Semiconductor Inc. can be used, and any devices may be used.

A cured product pattern of the photocurable and thermosetting resin composition of the present invention is obtained by developing the unexposed part after the exposure. The development can be performed by a dipping method, a shower method, a spray method and a brush method or the like. An alkaline water solution such as potassium hydroxide, sodium hydroxide, sodium carbonate, potassium carbonate, sodium phosphate, sodium silicate, ammonia and amines can be used as the developing solution.

The cured product of the photocurable and thermosetting resin composition of the present invention is heated, for example, to 140 to 180° C. after the development to thermal-cure the cured product, and thereby an insulated coating film having excellent adhesiveness, hardness, solder heat resistance, chemical resistance, solvent resistance, electric insulation and corrosion resistance is formed.

When the printed wiring board of the present invention is manufactured, a substrate having a printed wiring circuit is used in the formation method of the above pattern.

EXAMPLES

Now, the present invention will be described more specifically below with reference to examples and comparative examples. As a matter of course, the present invention is not limited to the following Examples.

Synthesis Example 1

Into a separable flask of 2L equipped with a stirrer, a thermometer, a reflux condenser, a dropping funnel and a nitrogen introducing pipe, 508 g of dipropylene glycol monomethyl ether (MFDG, produced by Nippon Nyukazai Co., Ltd.) was introduced. After heating the flask to 110° C., 174 g of a compound of an ethylene unsaturated group-containing carboxylic acid (n=2), 174 g of a methacrylic acid, 77 g of methylmethacrylate, 222 g of MFDG and 12.0 g of t-butylperoxy-2-ethylhexanoate (Perbutyl O, produced by Nippon Oil and Fats Co., Ltd.) were dropped over 3 hours. A stem polymer (copolymer) having a carboxyl group was syntesized by aging for 3 hours after dropping. Next, into this stem polymer solution, 289 g of 3,4-epoxy cyclohexyl methylacrylate (Cyclomer A200, produced by Daicel Chemical Industries, Ltd.), 3.0 g of triphenylphosphine and 1.3 g of methylhydroquinone were added, and were reacted at 100° C. for 10 hours. The reaction was performed under a mixed atmosphere of air/nitrogen. Thereby, a carboxylic acid-containing photosensitive resin solution having an acid value of 80 mgKOH/g, a double bond equivalent weight of 450 and a weight-average molecular weight of 25,000 was obtained. The following carboxylic acid-containing photosensitive resin solution is referred to as A-1 varnish.

Synthesis Example 2

Into a separable flask of 2L equipped with a stirrer, a thermometer, a reflux condenser and a dropping funnel and a nitrogen introducing pipe, 660 g of a cresol novolak type epoxy resin (EOCN-104S, produced by Nippon Kayaku Co., Ltd., softening point: 92° C., epoxy equivalent: 220), 421.3 g of carbitol acetate and 180.6 g of solvent naphtha were introduced, heated to 90° C., stirred, and dissolved. Next, the resultant solution was once cooled to 60° C. 216 g of an acrylic acid, 4.0 g of triphenylphosphine and 1.3 g of methylhydroquinone were added and reacted at 100° C. for 12 hours to obtain a reaction product having an acid value of 0.2 mgKOH/g. 241.7 g of tetrahydro phthalic anhydride was tucked into the reaction product, heated to 90° C., and reacted for 6 hours. Thereby, a carboxylic acid-containing photosensitive resin solution having an acid value of 50 mgKOH/g, a double bond equivalent weight of 400 and a weight-average molecular weight of 7,000 was obtained. The following carboxylic acid-containing photosensitive resin solution is referred to as A-2 varnish.

Synthesis Example 3

215 parts by mass of EPICLON N-680 (produced by Dainippon Ink and Chemicals Inc., epoxy equivalent=215) of a cresol novolak type epoxy resin were put into a four-necked flask equipped with a stirrer and a reflux condenser. Furthermore, 266.5 parts of carbitol acetate was added into the flask, heated and dissolved. 0.05 part of hydroquinone as a polymerization inhibitor and 1.0 parts by mass of triphenylphosphine as a reaction catalyst were added into the resin solution. This mixture was heated at 85 to 95° C., and 72 parts by mass of an acrylic acid was gradually dropped to react the mixture for 24 hours. 208 parts by mass of half urethane in which isoholondiisocyanate and pentaerythritoltriacrylate were previously reacted at 1:1 mol was gradually dropped into this epoxy acrylate, and was reacted at 60 to 70° C. for 4 hours. Now, a solution of a resin (F) thus obtained and having an obtained ethylenically unsaturated bond is referred to as F-1.

When the refractive index of each of the resin solutions of the synthesis examples 1, 2 thus obtained was measured, the refractive index of A-1 varnish was 1.525, and the refractive index of A-2 varnish was 1.557. Herein, the refractive index of the resin solution was measured based on JIS K7105.

After the resin solutions of the synthesis examples 1 to 3 were used, mixed at rates (part by mass) shown in Tables 1, 2 with the various components shown in Tables 1, 2, and preliminarily mixed by the stirrer, the mixture were kneaded with a three-roll mill to prepare a photocurable and thermosetting resin composition for solder resist. Herein, when the degree of dispersion of the obtained photocurable and thermosetting resin composition was estimated by a particle size measurement due to a grind meter produced by Erichsen Company, the degree of dispersion was 15 μm or less.

Next, the photocurable and thermosetting resin composition thus prepared was applied on a substrate by a screen printing method so that the thickness was set to 50 μm on a soda glass having a thickness of 2 mm. The photocurable and thermosetting resin composition was then dried for 30 minutes in a hot air circulation type drying oven of 80° C. A band path filter (produced by Kenko) of 405 nm was placed on the backside of the application surface of the soda glass after drying. The photosensitive resin composition was irradiated with an active energy ray of 40 mJ/cm$^2$ by using an exposure device 680GW (produced by ORC Company) in which a light source is a metal halide lamp. After the irradiation, a pattern was formed by developing the photosensitive resin composition using a 1 mass % of sodium carbonate solution of 30° C., and a cured coating film was obtained by thermal-curing the photosensitive resin composition at 150° C. for 60 minutes.

The deep part curability and surface curability of the cured coating film of the photocurable and thermosetting resin composition for solder resist thus obtained was evaluated.

Referring to the curing properties in deep portions, the film thickness of an arbitrary place was measured by using a surface roughness meter. Referring to the valuation standard, the film thickness of 30 μm or more, the film thickness of 25 μm or more and less than 30 μm, and the film thickness of 25 μm or less were represented by "◯", "Δ" and "×" respectively.

Referring to the surface curability, the degree of brilliancy at 60 degrees was evaluated by using a brilliance meter (Microtrigross, produced by BYK Gardner Company). Referring to the valuation standard, the degree of brilliancy of 50 or more after the development was represented by "◯", and the degree of brilliancy of less than 50 was represented by "×".

The evaluation results are shown in Tables 1 and 2.

TABLE 1

|  | Inv. | | Comp. | | | |
| --- | --- | --- | --- | --- | --- | --- |
|  | 1 | 2 | 1 | 2 | 3 | 4 |
| A-1 varnish | 190 | 190 | 190 | 190 | 190 | 190 |
| Filler B-1 | 100 | — | — | — | — | — |
| Filler B-2 | — | 100 | — | — | — | — |
| Filler B-3 | — | — | 100 | — | — | — |
| Filler B-4 | — | — | — | 100 | — | — |
| Filler B-5 | — | — | — | — | 100 | — |
| Filler B-6 | — | — | — | — | — | 100 |

TABLE 1-continued

|  | Inv. | | Comp. | | | |
| --- | --- | --- | --- | --- | --- | --- |
|  | 1 | 2 | 1 | 2 | 3 | 4 |
| Photopolymerization initiator C-1 | 5.0 | 5.0 | 5.0 | 5.0 | 5.0 | 5.0 |
| Photopolymerization initiator C-2 | 3.0 | 3.0 | 3.0 | 3.0 | 3.0 | 3.0 |
| Sensitizer C-3 | 0.5 | 0.5 | 0.5 | 0.5 | 0.5 | 0.5 |
| Sensitizer C-4 | 0.4 | 0.4 | 0.4 | 0.4 | 0.4 | 0.4 |
| Photopolymerization monomer D-1 | 20.0 | 20.0 | 20.0 | 20.0 | 20.0 | 20.0 |
| Photopolymerization monomer D-2 | 15.0 | 15.0 | 15.0 | 15.0 | 15.0 | 15.0 |
| Epoxy resin E-1 | 18.0 | 18.0 | 18.0 | 18.0 | 18.0 | 18.0 |
| Epoxy resin E-2 | 5.0 | 5.0 | 5.0 | 5.0 | 5.0 | 5.0 |
| Epoxy resin E-3 | 28.0 | 28.0 | 28.0 | 28.0 | 28.0 | 28.0 |
| F-1 varnish | 50.0 | 50.0 | 50.0 | 50.0 | 50.0 | 50.0 |
| Silicone antifoamer | 3.0 | 3.0 | 3.0 | 3.0 | 3.0 | 3.0 |
| Phthalocyanine blue | 1.7 | 1.7 | 1.7 | 1.7 | 1.7 | 1.7 |
| Anthraquinone yellow pigment | 3.0 | 3.0 | 3.0 | 3.0 | 3.0 | 3.0 |
| Curing catalyst 1 | 0.2 | 0.2 | 0.2 | 0.2 | 0.2 | 0.2 |
| Curing catalyst 2 | 10.0 | 10.0 | 10.0 | 10.0 | 10.0 | 10.0 |
| Organic solvent 1 | 35.0 | 35.0 | 35.0 | 35.0 | 35.0 | 35.0 |
| Content of benzene ring (%) | 1.8 | 1.8 | 1.8 | 1.8 | 1.8 | 1.8 |
| Refractive index of component (A) | 1.525 | 1.525 | 1.525 | 1.525 | 1.525 | 1.525 |
| Refractive index of component (B) | 1.459 | 1.650 | 2.520 | 2.090 | 1.540 | 1.590 |
| Difference between comp. (A) and (B) | 0.125 | 0.067 | 0.995 | 0.565 | 0.015 | 0.045 |
| Av. grain diameter of filler (μm) | 0.30 | 0.38 | 0.50 | 1.00 | 1.00 | 2.00 |
| Deep part curability | ◯ | ◯ | X | X | X | X |
| Surface curability | ◯ | ◯ | X | X | X | X |

TABLE 2

|  | Inv. | | Comp. | | | |
| --- | --- | --- | --- | --- | --- | --- |
|  | 3 | 4 | 5 | 6 | 7 | 8 |
| A-1 varnish | 156 | 156 | 156 | 156 | 156 | 156 |
| Filler B-1 | 100 | — | — | — | — | — |
| Filler B-2 | — | 100 | — | — | — | — |
| Filler B-3 | — | — | 100 | — | — | — |
| Filler B-4 | — | — | — | 100 | — | — |
| Filler B-5 | — | — | — | — | 100 | — |
| Filler B-6 | — | — | — | — | — | 100 |
| Photopolymerization initiator C-1 | 5.0 | 5.0 | 5.0 | 5.0 | 5.0 | 5.0 |
| Photopolymerization initiator C-2 | 3.0 | 3.0 | 3.0 | 3.0 | 3.0 | 3.0 |
| Sensitizer C-3 | 0.5 | 0.5 | 0.5 | 0.5 | 0.5 | 0.5 |
| Sensitizer C-4 | 0.4 | 0.4 | 0.4 | 0.4 | 0.4 | 0.4 |
| Photopolymerization monomer D-1 | 20.0 | 20.0 | 20.0 | 20.0 | 20.0 | 20.0 |
| Photopolymerization monomer D-2 | 15.0 | 15.0 | 15.0 | 15.0 | 15.0 | 15.0 |
| Epoxy resin E-1 | 18.0 | 18.0 | 18.0 | 18.0 | 18.0 | 18.0 |
| Epoxy resin E-2 | 5.0 | 5.0 | 5.0 | 5.0 | 5.0 | 5.0 |
| Epoxy resin E-3 | 28.0 | 28.0 | 28.0 | 28.0 | 28.0 | 28.0 |
| F-1 varnish | 50.0 | 50.0 | 50.0 | 50.0 | 50.0 | 50.0 |
| Silicone antifoamer | 3.0 | 3.0 | 3.0 | 3.0 | 3.0 | 3.0 |
| Phthalocyanine blue | 1.7 | 1.7 | 1.7 | 1.7 | 1.7 | 1.7 |
| Anthraquinone yellow pigment | 3.0 | 3.0 | 3.0 | 3.0 | 3.0 | 3.0 |
| Curing catalyst 1 | 0.2 | 0.2 | 0.2 | 0.2 | 0.2 | 0.2 |
| Curing catalyst 2 | 10.0 | 10.0 | 10.0 | 10.0 | 10.0 | 10.0 |
| Organic solvent 1 | 35.0 | 35.0 | 35.0 | 35.0 | 35.0 | 35.0 |
| Content of benzene ring (%) | 16 | 16 | 16 | 16 | 16 | 16 |
| Refractive index of component (A) | 1.557 | 1.557 | 1.557 | 1.557 | 1.557 | 1.557 |

TABLE 2-continued

|  | Inv. | | Comp. | | | |
| --- | --- | --- | --- | --- | --- | --- |
|  | 3 | 4 | 5 | 6 | 7 | 8 |
| Refractive index of component (B) | 1.459 | 1.650 | 2.520 | 2.090 | 1.540 | 1.590 |
| Difference between comp. (A) and (B) | 0.093 | 0.099 | 0.963 | 0.533 | 0.017 | 0.013 |
| Av. grain diameter of filler (μm) | 0.30 | 0.38 | 0.50 | 1.00 | 1.00 | 2.00 |
| Deep part curability | ○ | ○ | X | X | X | X |
| Surface curability | ○ | ○ | X | X | X | X |

In Tables 1, 2, each of components is as follows.
Filler B-1: Spherical Silica (1-FX, produced by Tatsumori), Refractive Index =1.459, Average Grain diameter=0.30 μm
Filler B-2: Barium sulfate (B-30, produced by Sakai Chemical Industry Co., Ltd.), Refractive Index=1.65, Average Grain diameter=0.38 μm
Filler B-3: Titanium Dioxide (KA-15, produced by TITAN KOGYOKABUSHIKI KAISHA), Refractive Index=2.52, Average Grain diameter=0.50 μm
Filler B-4: Antimony Pentoxide (NA-4800, produced by Nissan Chemical Industries Ltd.), Refractive Index=2.09, Average Grain diameter=1.00 μm
Filler B-5: Talc (SG-2000, produced by NIPPON TALC Co., Ltd.), Refractive Index=1.54, Average Grain diameter=1.00 μm
Filler B-6: Calcium Carbonate (Maruo Calcium Light Calcium Carbonate), Refractive Index=1.59, Average Grain diameter=2.00 μm
* The average grain diameter can be measured by a laser diffraction scattering method using, for example, a laser diffraction/scatter type particle size distribution measuring device.
Photopolymerization Initiator C-1:
2-acetyloxyiminomethyl)thioxanthen-9-one Photopolymerization Initiator C-2: 2-benzil-2-dimethylamino-1-(4-morpholinophenyl)-butane-1-one
Sensitizer C-3: 4-benzoyl-4'-methyldiphenylsulfide
Sensitizer C-4: 4,4'-diethylaminobenzophenone
Photopolymerization Monomer D-1: dipentaerythritol hexaacrylate
Photopolymerization Monomer D-2: trimethylolpropane triacrylate
Epoxy resin E-1: Phenol Novolac Type Epoxy Resin
(A varnish obtained by dissolving DEN438 produced by Dow Chemical Co. in carbitol acetate so that the nonvolatile content is set to 90%.)
Epoxy resin E-2: Cresol Novolak Type Epoxy Resin (A varnish obtained by dissolving EPICLON N-695 produced by Dainippon Ink and Chemicals Inc. in carbitol acetate so that the nonvolatile content is set to 75%.)
Epoxy resin E-3: Bixylenol Type Epoxy Resin (EPIKOTE YX-4000, produced by Japan Epoxy resin K.K.)
Curing Catalyst 1: 1-benzyl-2-phenylimidazole
Curing Catalyst 2: 2,4,6-triamino-1,3,5-triazine
Organic Solvent 1: dipropylene glycol monomethyl ether As is observed from Tables 1 and 2, when the difference between the refractive index of the carboxylic acid-containing photosensitive resin (A) and that of the filler (B) is 0.2 or less, and the average grain diameter of the filler (B) is 0.05 to 0.5 μm, excellent deep part curability and surface curability at 405 nm are obtained.

What is claimed is:

1. A photocurable and thermosetting resin composition comprising:
   (A) a carboxylic acid-containing photosensitive resin having at least one carboxyl group and at least two ethylenically unsaturated bonds in its molecule;
   (B) a filler;
   (C) a photopolymerization initiator;
   (D) a diluent; and
   (E) a compound having at least two cyclic ether groups and/or cyclic thioether groups in its molecule,
   wherein the difference between the refractive index of the carboxylic acid-containing photosensitive resin (A) and that of the filler (B) is 0.20 or less, and the average grain diameter of the filler (B) is 0.5 to 0.05 μm,
   wherein the photocurable and thermosetting resin composition can be developed by a diluted alkali solution, and can be pattern-formed by a laser oscillation light source of 350 to 420 nm in wavelength,
   wherein the content of benzene rings in the photocurable and thermosetting resin composition is 20 parts by mass or less per 100 parts by mass of the total amount of the carboxylic acid-containing photosensitive resin (A) and the diluent (D), and
   wherein the filler (B) comprises at least one of silica or barium sulfate.

2. The photocurable and thermosetting resin composition according to claim 1, further comprising (F) a resin having an ethylenically unsaturated bond.

3. The photocurable and thermosetting resin composition according to claim 2, wherein the content of benzene rings in the photocurable and thermosetting resin composition is 20 parts by mass or less per 100 parts by mass of the total amount of the carboxylic acid-containing photosensitive resin (A), the diluent (D) and the resin (F).

4. The photocurable and thermosetting resin composition according to claim 1, wherein the filler (B) is (B-1) said silica.

5. The photocurable and thermosetting resin composition according to claim 4, wherein the grain shape of the silica (B-1) is a sphere.

6. A photocurable and thermosetting dry film obtained by applying the photocurable and thermosetting resin composition according to claim 1 onto a base film and drying the resin composition.

7. A resin pattern obtained by photocuring the photocurable and thermosetting resin composition according to claim 1 with a laser beam of 350 to 420 nm in wavelength and by developing the photocured resin composition with a diluted alkali solution.

8. A resin pattern obtained by photocuring the dry film according to claim 6 with a laser beam of 350 to 420 nm in wavelength and developing the photocured film with a diluted alkali solution.

9. A cured product obtained by photocuring the photocurable and thermosetting resin composition according to claim 1 with a laser beam of 350 to 420 nm in wavelength and by thermal-curing the photocured resin composition.

10. A cured film obtained by photocuring the dry film according to claim 6 with a laser beam of 350 to 420 nm in wavelength and by thermal-curing the photocured film.

11. A printed writing board having the cured product according to claim 9.

12. A printed writing board having the cured film according to claim 10.

13. The resin pattern according to claim 7, wherein the exposure energy of the laser beam is 100 mJ/cm$^2$ or less.

14. The resin pattern according to claim 8, wherein the exposure energy of the laser beam is 100 mJ/cm$^2$ or less.

15. The cured product according to claim 9, wherein the exposure energy of the laser beam is 100 mJ/cm$^2$ or less.

16. The cured film according to claim 10, wherein the exposure energy of the laser beam is 100 mJ/cm$^2$ or less.

17. The printed writing board according to claim 11, wherein the exposure energy of the laser beam is 100 mJ/cm$^2$ or less.

18. The printed writing board according to claim 12, wherein the exposure energy of the laser beam is 100 mJ/cm$^2$ or less.

* * * * *